United States Patent [19]
Winn et al.

[11] Patent Number: 5,910,751
[45] Date of Patent: Jun. 8, 1999

[54] CIRCUIT ARRANGEMENT AND METHOD WITH TEMPERATURE DEPENDENT SIGNAL SWING

[75] Inventors: Gregory Scott Winn; Raymond Alan Richetta, both of Rochester, Minn.

[73] Assignee: International Business Machines Corporation, Armonk, N.Y.

[21] Appl. No.: 08/800,608

[22] Filed: Feb. 14, 1997

[51] Int. Cl.⁶ ................................ H03G 5/22; H03F 1/30
[52] U.S. Cl. .......................... 327/560; 327/512; 327/513; 330/289
[58] Field of Search .................... 327/560, 512, 327/513, 378, 331, 332, 306, 307, 315; 330/289, 279, 254, 256

[56] References Cited

U.S. PATENT DOCUMENTS

| | | | |
|---|---|---|---|
| 3,667,064 | 5/1972 | Thornton et al. | 330/23 |
| 3,714,462 | 1/1973 | Blackmer | 307/229 |
| 4,000,472 | 12/1976 | Eastland et al. | 329/204 |
| 4,260,956 | 4/1981 | Hartford | 330/289 |
| 4,319,196 | 3/1982 | Kwan | 329/204 |
| 4,320,346 | 3/1982 | Healey, III | 329/101 |
| 4,523,155 | 6/1985 | Walczak et al. | 330/279 |
| 4,665,311 | 5/1987 | Cole | 250/214 |
| 4,967,082 | 10/1990 | Cooke et al. | 250/338.3 |
| 5,008,632 | 4/1991 | Sutterlin | 330/256 |
| 5,132,632 | 7/1992 | Russell et al. | 328/16 |
| 5,177,453 | 1/1993 | Russell et al. | 330/284 |
| 5,408,697 | 4/1995 | Price et al. | 455/239.1 |
| 5,459,679 | 10/1995 | Ziperovich | 364/602 |
| 5,481,218 | 1/1996 | Nordholt et al. | 327/350 |
| 5,526,058 | 6/1996 | Sano et al. | 348/647 |
| 5,576,662 | 11/1996 | Price et al. | 330/277 |

FOREIGN PATENT DOCUMENTS 2256550  12/1992  United Kingdom .

Primary Examiner—Timothy P. Callahan
Assistant Examiner—An T. Luu
Attorney, Agent, or Firm—Scott A. Stinebruner; Tyler L. Nasiedlak; Merchant, Gould, Smith, Edell, Welter & Schmidt

[57] ABSTRACT

A circuit arrangement and method vary in response to temperature changes the signal swing of an input signal to an analog circuit which has a temperature-dependent effective linear signal range. A variable gain circuit varies the signal swing of the input signal in response to a control signal supplied thereto by a temperature control circuit so that the signal swing tracks changes in the effective linear signal range of the analog circuit. In this manner, signal to noise ratio may be optimized and distortion may be minimized over a range of operating temperatures for the analog circuit.

25 Claims, 7 Drawing Sheets

CIRCUIT ARRANGEMENT AND METHOD WITH TEMPERATURE DEPENDENT SIGNAL SWING

FIELD OF THE INVENTION

The invention generally relates to analog circuits, and more particularly, to the optimization of such circuits for in response to changes in temperature.

BACKGROUND OF THE INVENTION

An important concern for any analog circuit design is noise, which is often measured in terms of a signal to noise ratio (SNR) parameter for the circuit. The presence of noise in a circuit degrades the precision of analog signals as well as other performance-related parameters for the circuit. Consequently, it is often desirable to minimize noise in most analog circuit designs.

As is inherent from a signal to noise ratio parameter, noise effects are typically minimized by decreasing the level of noise and/or by increasing the level of the signal relative to noise. However, due to other competing concerns, such as total harmonic distortion (THD) and/or signal delays, e.g., due to phase shifting, the ability to increase the SNR of an analog circuit by conventional methods may be limited.

For example, one analog circuit in which noise minimization is desired is a continuous time low pass anti-aliasing filter in a partial response maximum likelihood (PRML) read/write channel of a hard disk drive system. It is desirable in such circuits to increase SNR and decrease THD to minimize the bit error rate (BER) of the channel. Consequently, the goal in such circuits is often to keep the signal swing as large as possible without causing distortion.

However, another important concern for many analog circuit designs is that of the effects of temperature, since analog circuits may be required to operate over wide operating ranges. Due to temperature dependencies in many analog circuit components, e.g., transistors, operational parameters including but not limited to gain, SNR, effective linear signal range—the maximum permissible input signal level to a component which does not cause distortion—may vary. This often requires such analog circuits to be designed for worst case operation, which limits the overall performance of such circuits over their entire operating ranges.

For example, in many low pass filter and other analog circuit designs, the effective linear signal range of the circuits may vary directly with temperature. Often, the signal swings of the inputs to such circuits must be set to levels which do not cause distortion at colder temperatures, even though the effective linear signal ranges of such circuits may be greater at their normal operating temperatures.

Therefore, a significant need exists for a manner of optimizing the performance of analog circuits over a range of operating temperatures.

SUMMARY OF THE INVENTION

The invention addresses these and other problems associated with the prior art in providing a circuit arrangement and method which vary in response to temperature changes the signal swing of an input signal to an analog circuit which has a temperature-dependent effective linear signal range. In the illustrated embodiments of the invention, a variable gain circuit, controlled via a control signal generated by a temperature control circuit, is used to control the signal swing of the input signal such that it varies with temperature variations in the effective linear signal range of the analog circuit. As such, the input signal swing may be controlled in a manner which optimizes SNR and minimizes distortion over a range of operating temperatures.

These and other advantages and features, which characterize the invention, are set forth in the claims annexed hereto and forming a further part hereof. However, for a better understanding of the invention, and of the advantages and objectives attained through its use, reference should be made to the Drawing, and to the accompanying descriptive matter, in which there is described illustrated embodiments of the invention.

DETAILED DESCRIPTION OF THE ILLUSTRATED EMBODIMENTS

Figure 1:
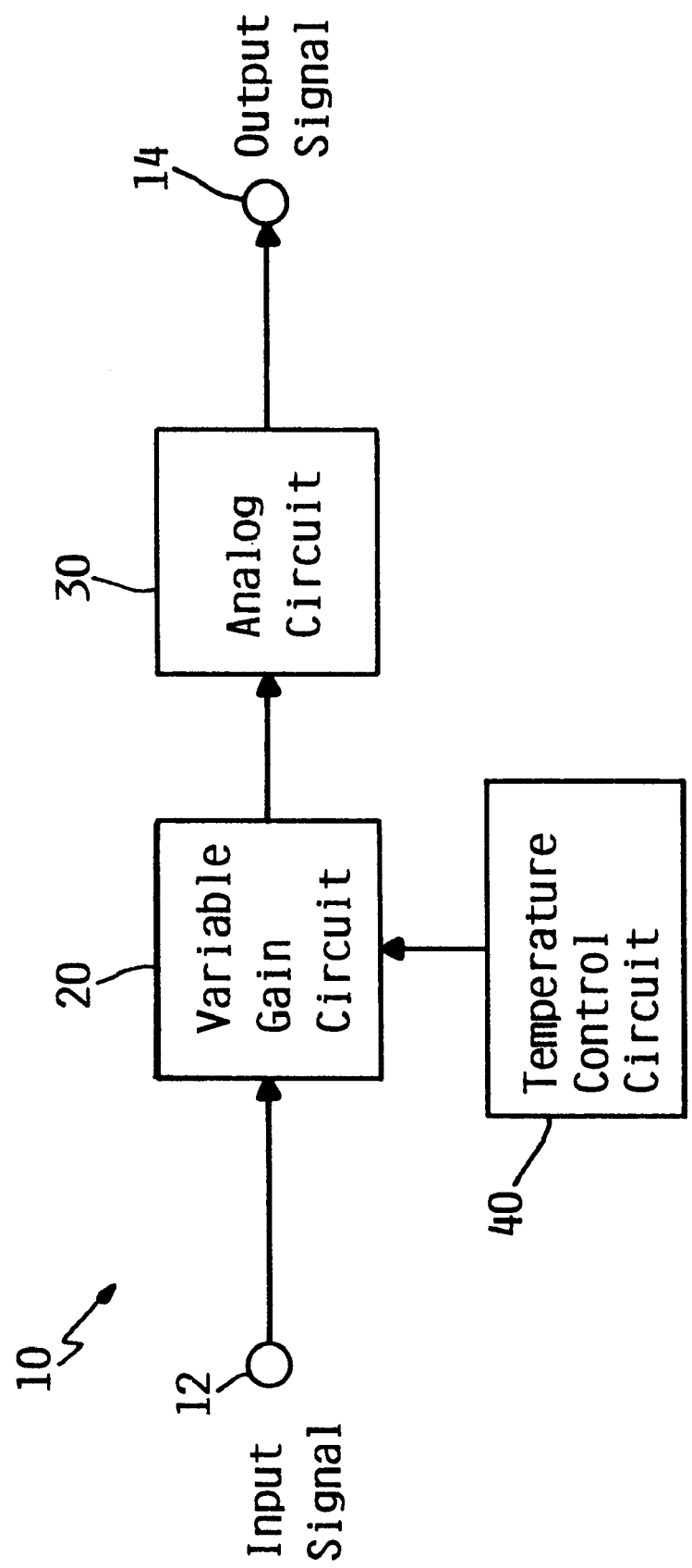
FIG. 1 is a block diagram of a circuit arrangement consistent with the principles of the invention.

Turning to the Drawing, wherein like parts are denoted by like numbers throughout the several views, FIG. 1 illustrates a circuit arrangement 10 consistent with the principles of the invention. Circuit arrangement 10 generally includes a variable gain circuit 20 which amplifies an input signal and outputs the amplified input signal to an analog circuit 30. Analog circuit 30 has an effective linear signal range which limits the permissible signal swing of the amplified input signal, and which varies with changes in temperature. In addition, analog circuit 30 outputs an output signal 14 which is a function of the amplified input signal. A temperature control circuit 40 outputs a control signal to variable gain circuit 20 to vary the signal swing of the amplified signal in response to changes in temperature.

Variable gain circuit 20 may include any amplification circuit having a variable gain controlled via a control signal. The amplification circuit may have any range of gains, including gains of less than one, whereby the amplification circuit would in effect attenuate the input signal.

Analog circuit 30 may be practically any type of circuit arrangement having an effective linear signal range which varies either directly or inversely with temperature. Suitable types of circuits may include filters, amplifiers, and other signal processors, and may also include hybrid analog circuits which include digital components as well. One particular analog circuit having these characteristics is a bipolar differential amplifier, which has an input signal linearity limit that varies with temperature.

Temperature control circuit 40 may include any temperature-responsive component which has an operating parameter which varies with temperature. For example, one simple temperature control circuit may include a thermistor which has a resistance which varies with temperature.

Alternatively, an active component such as a transistor or other amplifier may be included in temperature control circuit 40 to provide the control signal. For example, as will be discussed in greater detail in connection with FIG. 7, a differential pair of bipolar transistors may be configured to have a gain which varies inversely with temperature by biasing the differential pair with zero temperature coefficient current and zero temperature coefficient collector load resistors. Other temperature responsive components and circuit arrangements may be used consistent with the invention.

In the illustrated embodiments, temperature control circuit 40 is configured to vary the gain of variable gain circuit 20 to effectively "track" the effective linear signal range of analog circuit 30. In this manner, the signal swing of the amplified input signal may be maintained at least approximately a fixed amount less than the maximum signal swing permitted by the analog circuit at a given temperature. Consequently, improved SNR may be obtained since the signal level increases without a corresponding increase in noise. In addition, the analog circuit is used more efficiently since its full linear signal range is being utilized throughout the entire range of operating temperatures, rather than just for worst case conditions.

Figure 2:
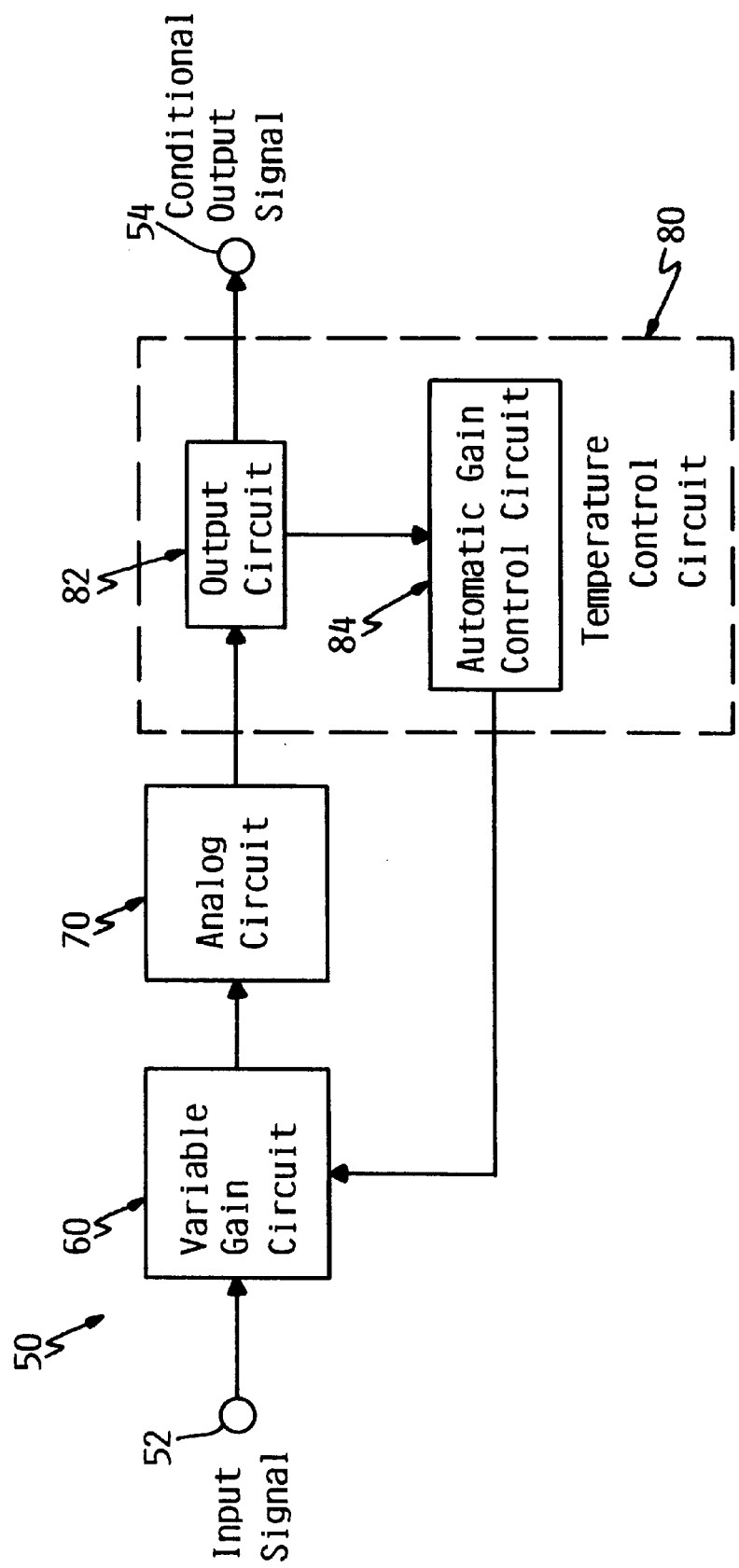
FIG. 2 is a block diagram of another circuit arrangement consistent with the principles of the invention.

As shown in FIG. 1, temperature control circuit 40 need not be a closed loop control system. In the alternative, a closed loop control system may be used to generate a control signal. For example, as shown in FIG. 2, a circuit arrangement 50 may include a variable gain circuit 60, an analog circuit 70, and a temperature control circuit 80 which includes an output circuit 82 and an automatic gain control (AGC) circuit 84. Variable gain circuit 60 receives an input signal 52 and outputs an amplified input signal. The amplified input signal is received and processed by analog circuit 70 into an output signal, which is passed to an output circuit 82 that conditions, e.g., level shifts, offsets, amplifies, etc., the output signal and outputs a conditioned output signal at 54.

A feedback control signal is also generated by output circuit 82, which is subsequently processed by AGC circuit 84 to generate an appropriate control signal to the variable gain circuit. In this manner, an output of the circuit arrangement is used as feedback in generating the control signal.

It should be appreciated that the feedback control signal utilized by AGC circuit 84 may be a separate signal output from output circuit 82, or may simply be the conditioned output signal output at 54. In addition, the feedback control signal may also be provided from analog circuit 70. In general, any signal generated by circuit arrangement 50 which varies with temperature may be used by temperature control circuit 80 to generate the appropriate control signal to variable gain circuit 60. Moreover, it should be appreciated that various level and/or offset shifting arrangements may be utilized to generate an appropriate control signal to permit the signal swing of the amplified input signal to track the effective linear signal range of the analog circuit. It may also be desirable to control the respective gains of variable gain circuit 60 and output circuit 82 such that a substantially fixed level output signal may be generated by the circuit arrangement.

It should be appreciated that a vast number of circuit arrangements may be utilized to provide temperature dependent signal swing control consistent with the invention. One such arrangement 100, primarily suitable for use in a PRML read/write channel for a hard disk drive, is illustrated in greater detail in FIGS. 3–7. However, it should be appreciated that circuit arrangement 100 is but one of many possible applications, and thus the invention should not be limited to this particular application.

Circuit arrangement 100 generally includes a pre-amp 106 which in a read mode receives signals from a drive head 104 that reads a storage medium or disk 102. A variable gain amplifier (VGA) 108 receives the signal output from the pre-amp as an input signal, and outputs therefrom an amplified input signal to a continuous time filter (CTF) 110. CTF 110, which functions as the analog circuit in this embodiment, outputs an output signal to an output driver 120.

VGA 108, CTF 110 and output driver 120 are configured to generate a fixed output signal, e.g., an output signal with a fixed signal swing, from a varying input signal. To this extent, output driver 120 has a gain that varies inversely with temperature, whereby the signal swing of the amplified output signal provided by driver 120 decreases with an increase in temperature. VGA 108 is controlled by a temperature-dependent control signal as discussed below to increase its gain with an increase in temperature. As also discussed below, CTF 110 has a fixed gain which is unaffected by temperature.

The output of driver 120 is passed to an analog finite impulse response filter (AFIR) 122, which then outputs to a 6-bit analog to digital converter (ADC) 126. A digital logic circuit 128 receives the digital output of ADC 126 and outputs the data signal for the read channel. It should be appreciated that AFIR 122 may also be implemented as a digital filter in digital logic 128. It should also be appreciated that in general the retrieval of digital data from a hard disk through a PRML read/write channel is well known in the art, and is not relevant to an understanding of the operation of the invention.

Circuit arrangement 100 is similar in many respects to circuit arrangement 50 in that an automatic gain control circuit is utilized to generate the control signal for VGA 108. In this embodiment, the AGC circuit is formed by AFIR 122, ADC 126, and digital logic 128, as well as by an envelope detector 124, charge pump 130, AGC loop or integrating capacitor 132 and level translator/gain adjust (LTGA) circuit 134. Integrating capacitor 132 is coupled across the differential signal paths between charge pump 130 and LTGA circuit 134, which have been combined into one line in FIG. 3 for ease of illustration. However, if differential signals are not utilized, capacitor 132 may instead be coupled to ground.

Envelope detector 124 includes three comparators designed to level detect the signal generated by CTF 110 and output digital logic signals to digital logic 128. Charge pump 130 receives digital logic signals from digital logic 128 to supply or remove current or charge to or from integrating capacitor 132 and thereby vary the potential across the capacitor. Charge pump 130 may also receive logic signals from digital logic 128 to control the rate at which current is supplied or removed and thereby vary loop response. LTGA circuit 134 is optionally included to ensure proper drive levels to the VGA as well as appropriate VGA gain to control voltage slope.

It should be appreciated that a number of the components in the AGC loop, including but not limited to AFIR 122 and LTGA circuit 134, may not be required for generating the control signal in certain applications. Implementation of the various components in the AGC loop is in general known in the art. In addition, it should be appreciated that other automatic gain control circuits are in general known in the art and may be used to generate a suitable control signal for VGA 108.

Moreover, it should be appreciated that in the illustrated embodiment pre-amp 106, VGA 108, CTF 110, output driver 120, AFIR 122 and LTGA circuit 134 in the illustrated embodiment are differential circuits, and that ADC 126 receives a differential signal as input and charge pump 130 outputs a differential signal. However, these components may alternately process non-differential signals consistent with the invention.

Generally, during a non-read operation, the AGC loop is locked through envelope detector 124, which receives the output signal from driver 120. The outputs of the comparators in envelope detector 124 are utilized by digital logic 128 to determine the current to apply to the integrating AGC loop capacitor 132 via charge pump 130. In the event that the VGA gain is too high, the comparators in envelope detector 124 control digital logic 128 to generate an appropriate signal to pull charge out of capacitor 132, thereby reducing the voltage presented to VGA 108. If the VGA gain is too low, the opposite occurs and the capacitor voltage is increased as is the VGA gain. Operation during a read operation is similar in nature, except that gain corrections are calculated from raw ADC samples rather than the analog waveform presented to envelope detector 124.

Consequently, when circuit arrangement 100 is at a lower temperature, e.g., either due to environmental conditions or initial power-up, the linear signal range of CTF 110 is relatively small. The gain of output driver 120 is relatively large, and through control of the AGC loop, the control signal to VGA 108 controls the VGA to ensure that the amplified input signal stays within the linear signal range of CTF 110. Then, as the temperature increases, the gain of output driver 120 decreases, and through control of the AGC loop, the control signal to VGA 108 increases the gain of the VGA such that the signal swing of the amplified input signal increases along with the linear signal range of CTF 110. In this manner, SNR is maximized throughout the temperature operating range of circuit arrangement 100.

Figure 4:
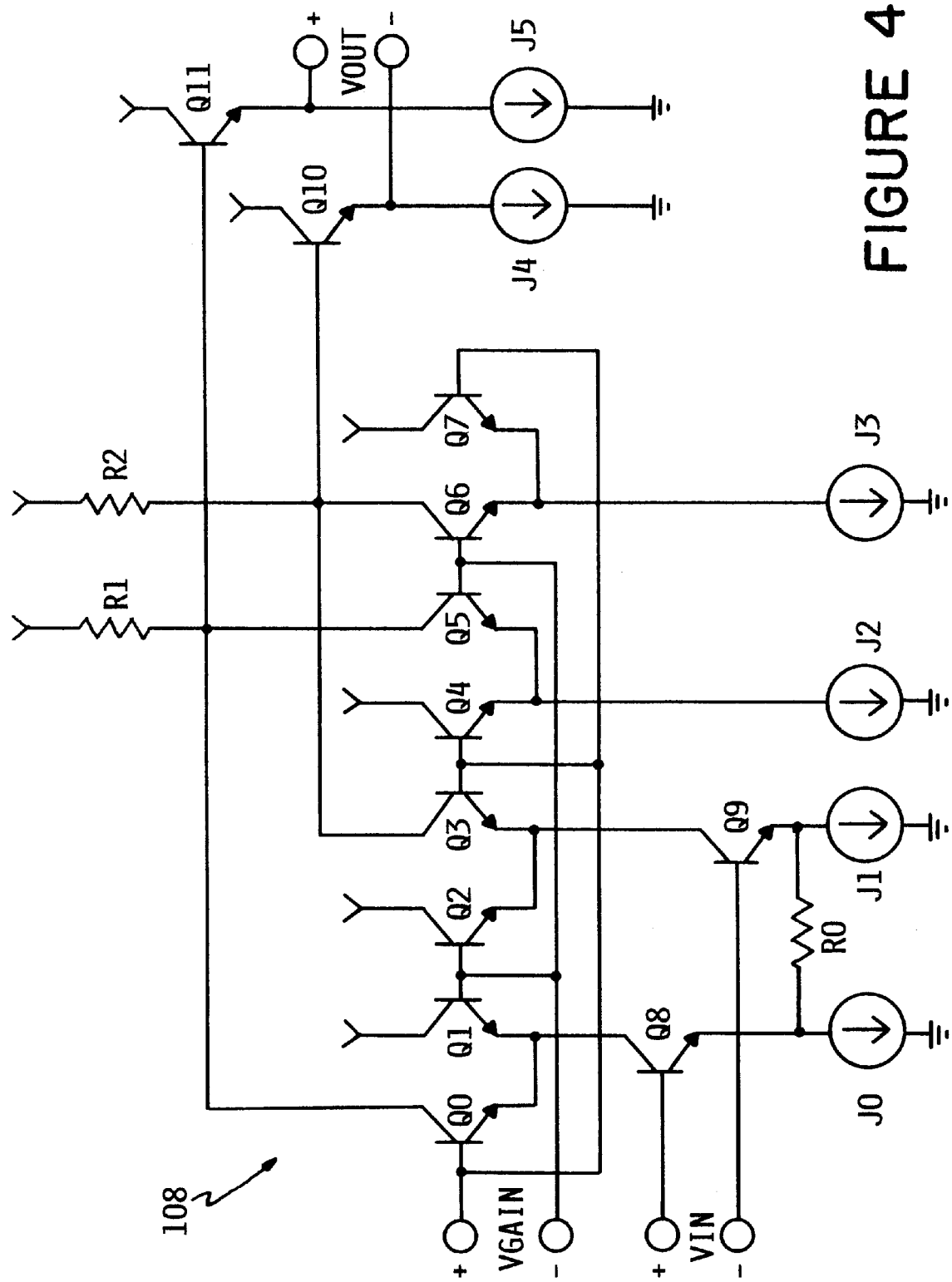
FIG. 4 is a schematic diagram of the variable gain amplifier in the circuit arrangement of FIG. 3.

VGA 108 is shown in greater detail in FIG. 4. In this circuit arrangement, a DC voltage control signal is applied across the VGAIN+ and VGAIN− terminals and is fed to the base of a series of bipolar transistors Q0–Q7, with the current through transistors Q0, Q3, Q4 and Q7 increasing, and the current through transistors Q1, Q2, Q5 and Q6 decreasing, in response to an increase in the control signal. As a result, a greater portion of the current generated across resistor R0 from the input signal applied at the VIN terminals is output at resistors R1 and R2 to vary the gain of the circuit arrangement. Transistors Q4–Q7 and current sources J2 and J3 function to maintain a constant DC current through resistors R1 and R2 to keep the various transistors in the circuit arrangement from saturating at higher gains.

Other variable gain amplification circuits may be used in the alternative.

Figure 3:
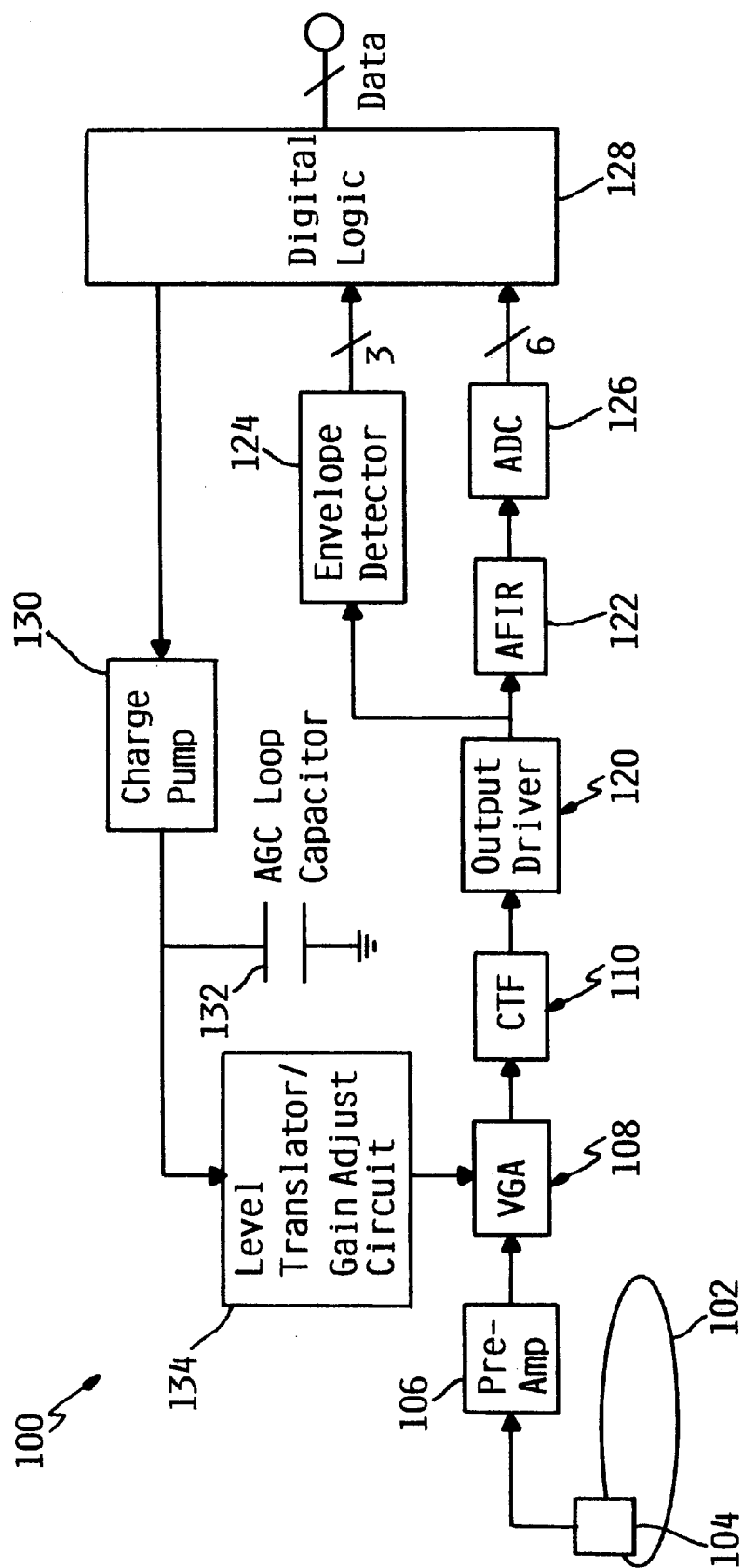
FIG. 3 is a block diagram of a hard disk drive incorporating another circuit arrangement consistent with the principles of the invention.
Figure 5:
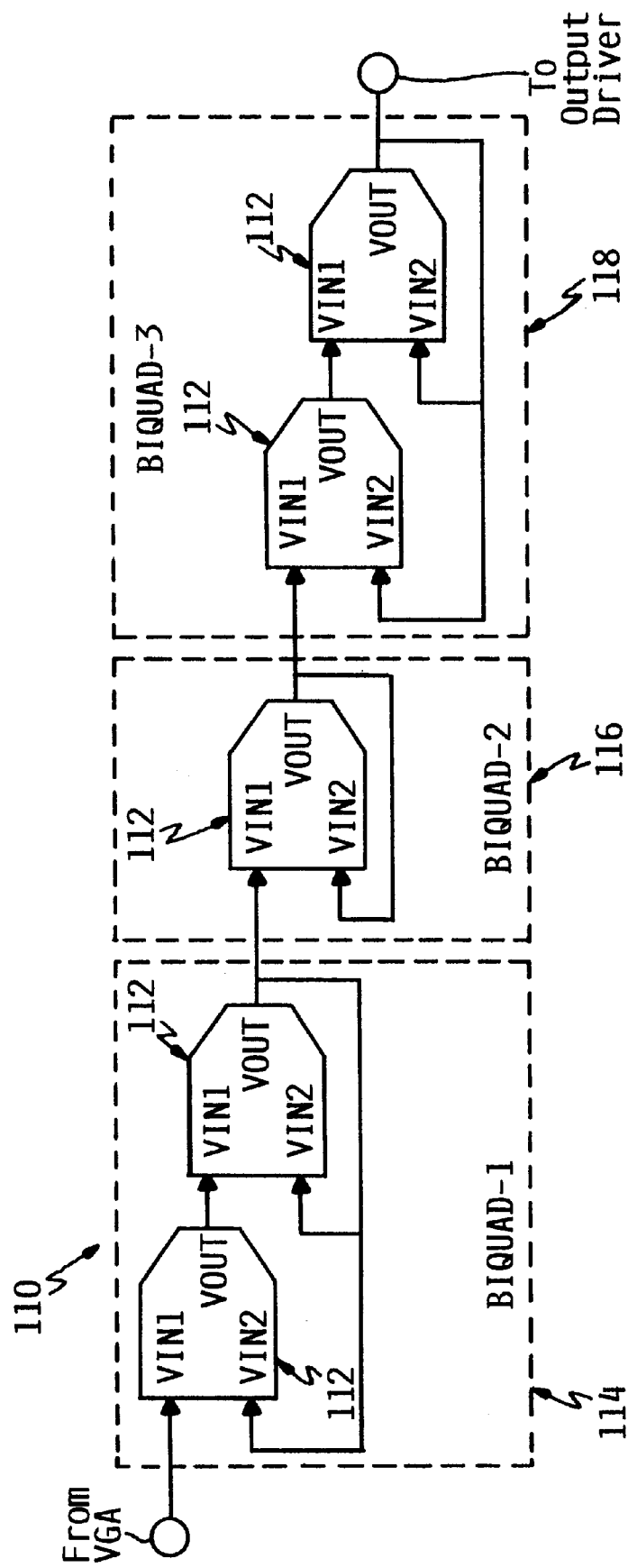
FIG. 5 is a block diagram of the continuous time filter in the circuit arrangement of FIG. 3.

As discussed above, the analog circuit utilized in the illustrated embodiment of FIG. 3 is a continuous time filter 110, which may be implemented as a five pole low pass filter as shown in FIG. 5. A series of five operational transconductance amplifiers (OTA) 112 are utilized to form three biquad stages 114, 116 and 118. The VIN1 input of the first OTA 112 in each of stages 114 and 118 receives an input signal and outputs an output signal to the VIN1 input of the second OTA 112. The output signal from the second OTA 112 is negatively fed back to the VIN2 inputs of each OTA 112. For stage 116, the VIN1 input of the OTA 112 receives the input signal for the stage, and output signal is negatively fed back to the VIN2 input.

In the illustrated embodiment, each OTA is implemented as a differential circuit, with differential signals passed between the OTA's. Therefore, negative feedback is provided by reversing the phase of the feedback signal, e.g., by coupling the positive signal path for the feedback signal to the negative terminal of the VIN2 input, and the negative signal path to the positive terminal.

Figure 6:
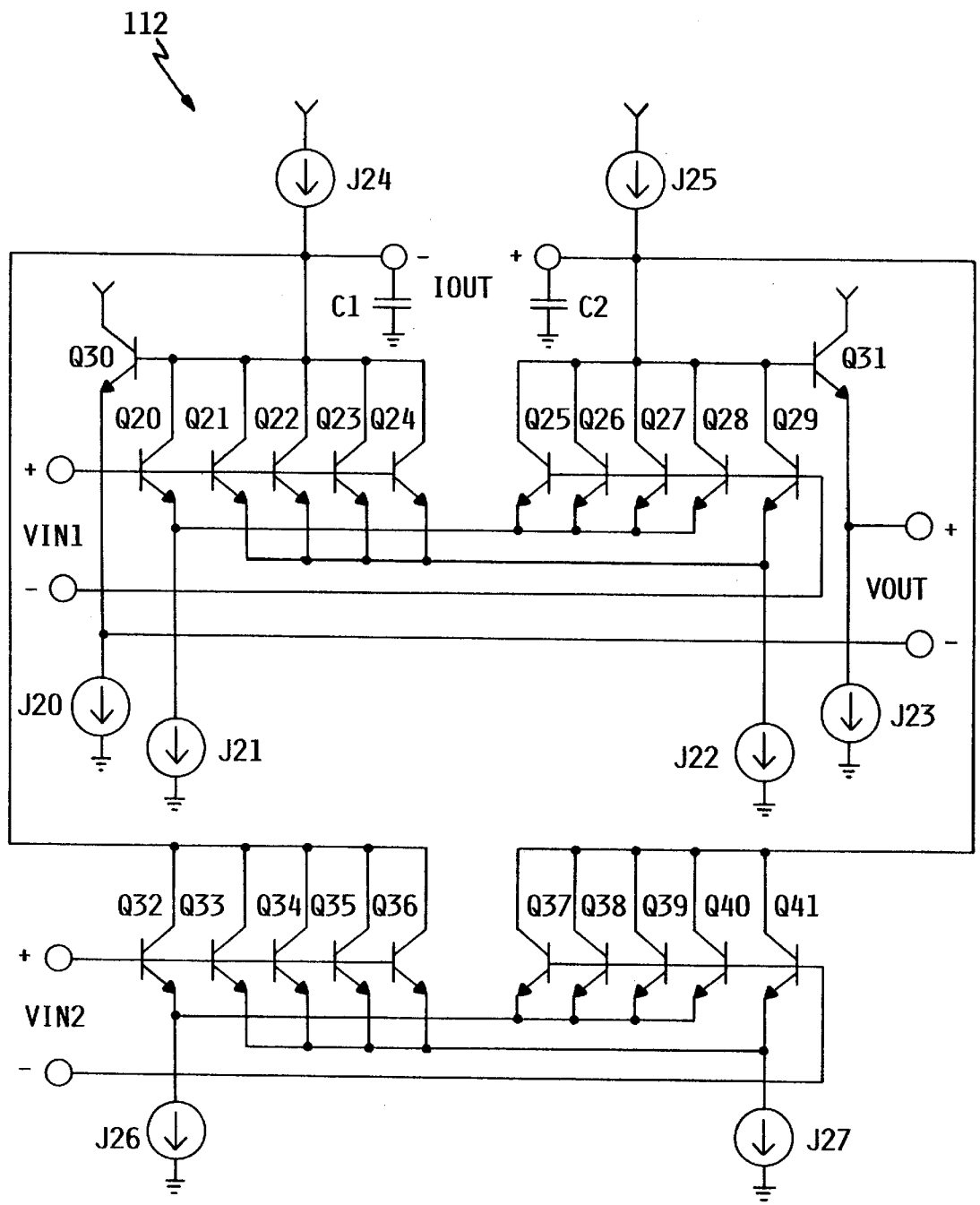
FIG. 6 is a schematic diagram of an operational transconductance amplifier in the continuous time filter of FIG. 5.

Each OTA 112 may be implemented using a bipolar differential amplifier utilizing emitter-coupled pairs, e.g. transistors Q20–Q29 and transistors Q32–Q41, as shown in FIG. 6. A pair of drive transistors Q30 and Q31 coupled at their emitters to current sources J20 and J23 generate the differential voltage output signal VOUT. Each OTA 112 may be identically configured as in FIG. 6, with the bias currents J20–J27 in each OTA 112 separately selected to provide the desired transfer function. Moreover, the current outputs of each OTA 112, IOUT+ and IOUT−, are tied to ground by capacitors C1 and C2.

The emitter-coupled pairs are scaled with a 1:4 to 4:1 paralleled ratio, which improves effective linear signal range threefold compared to conventional nonresistor degenerated emitter-coupled pairs. Also, with this configuration, transconductance, $g_m$, is reduced by 64%, and input-referred noise is increased by 25%, resulting in a net improvement in input dynamic range of 2.4. A similar configuration is discussed, for example, in UK Patent Application No. GB 2 256 550 A to Silicon Systems Inc., which is incorporated by reference herein.

Moreover, it may be realized that the allowable input signal range for linear, low distortion output signals in all forms of bipolar differential amplifiers is related to the thermal voltage, $V_t = kT/q$, where k is the Boltzmann constant, T is temperature in Kelvin, and q is electronic charge in Coulombs. Consequently, as $V_t$ increases with temperature, the allowable input signal for each OTA 112 also increases. It should also be appreciated, however, that the passband gain of CTF 110 is fixed and is unaffected by temperature because it is set by the ratios of the $g_m$'s of the OTA's.

Other filter designs may be used to implement CTF 110 consistent with the invention.

Figure 7:
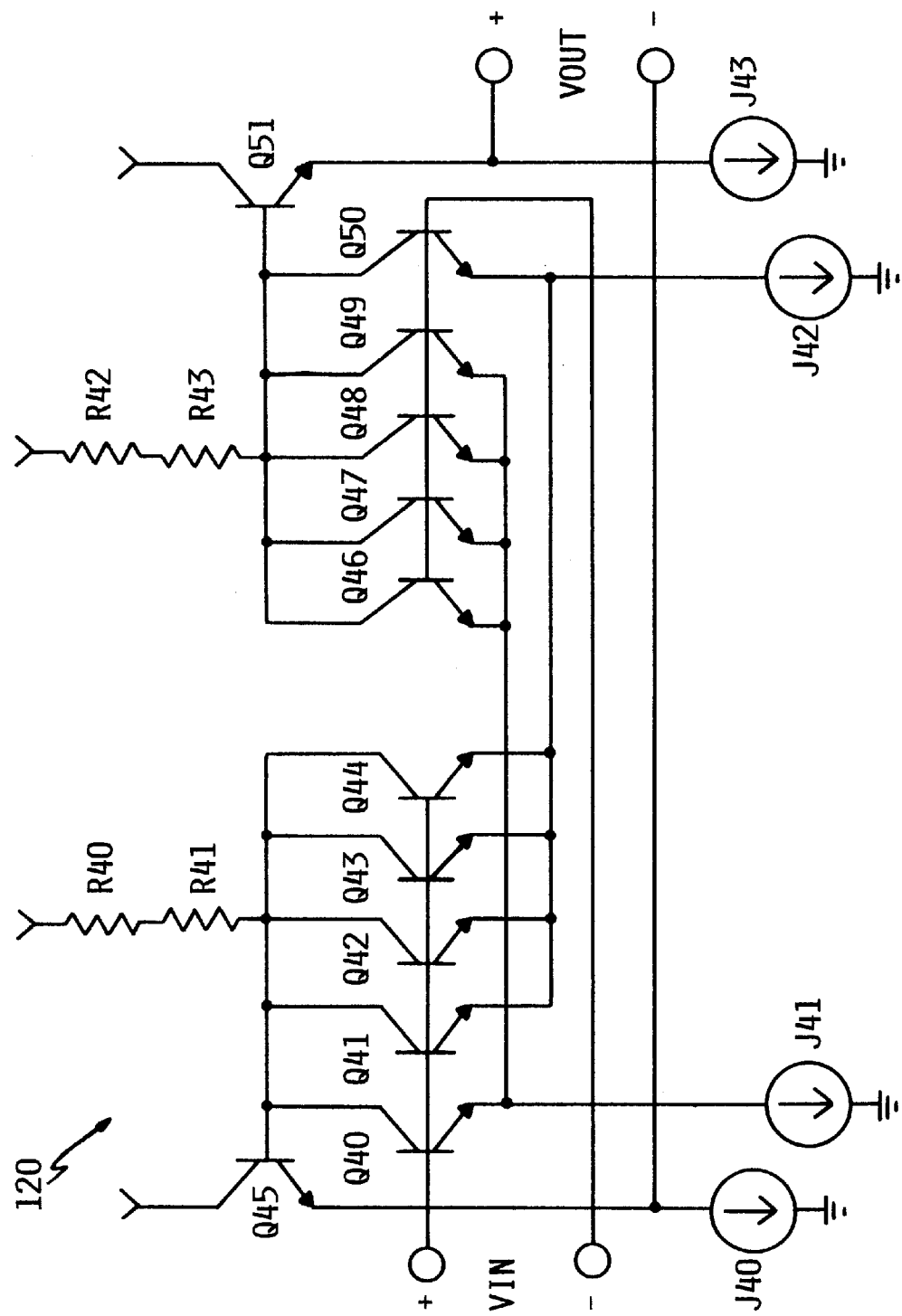
FIG. 7 is a schematic diagram of the output driver in the circuit arrangement of FIG. 3.

Output driver 120 is illustrated in greater detail in FIG. 7. As discussed above, the gain of output driver 120 is designed to decrease with temperature. As with each OTA 112, output driver 120 includes a bipolar differential amplifier which uses 1:4 to 4:1 emitter-coupled pairs of transistors Q40–Q44 and Q46–Q50 to minimize distortion and increase SNR and linear signal range. By using the same 1:4 to 4:1 ratio as each OTA 112, the gain of output driver 120 decreases at substantially the same rate as the effective linear signal range of each OTA 112 increases.

Output transistors Q45 and Q51, biased by current sources J40 and J43, generate the VOUT differential signal from the emitter-coupled pair. To obtain a gain which decreases with temperature, the emitter-coupled pairs are biased with zero temperature coefficient current from current sources J41 and J42 and with zero temperature coefficient collector load resistors R40–R43. This gain relationship exists because the dynamic resistance $r_e$ for the emitter-coupled pair, which is the inverse of the transconductance, or $1/g_m$, is equivalent to $V_t/I_c$, where $I_c$ is the collector current in the signal path bipolars. Thus, $r_e$ is directly proportional to the thermal voltage $V_t$, and consequently, is directly proportional to temperature. The gain of a bipolar differential pair is equal to $2 \times R_c / 2 \times r_e$. Therefore, by biasing the output driver with zero temperature coefficient current, i.e., where $I_c$ is temperature independent, and with zero temperature coefficient collector load resistors, i.e., where $R_c$ is temperature independent, $r_e$ will increase with temperature, and consequently the gain will decrease with temperature. With the configuration of the circuit arrangement of FIG. 3, it should be appreciated that the gain reduction in the output driver is typically made up in the VGA due to the AGC loop, thereby increasing the input swing through the OTA's and maintaining the fixed level output signal from the output driver.

Other output driver designs which exhibit decreasing gain with temperature may be used in the alternative. In addition, other output drivers having a gain which increases with temperature may be also be used in some applications, so long as the VGA and AGC loop are properly configured for this modification.

It should be appreciated that any of the above-described components may be implemented in differential or non-differential circuit arrangements. Moreover, other transistor technologies, e.g., FET technologies such as CMOS, may be used in lieu of bipolar designs.

Therefore, it should be appreciated that the illustrated embodiments of the invention provide significant advantages in maximizing SNR and minimizing distortion in analog circuits. Various modifications may be made to the illustrated embodiments without departing from the spirit and scope of the invention. Thus, the invention lies solely in the claims hereinafter appended.

What is claimed is:

1. A circuit arrangement, comprising:
   (a) a variable gain circuit coupled to receive an input signal and output therefrom an amplified input signal, the variable gain circuit having a gain that is controlled via a control signal;
   (b) an analog circuit coupled to receive the amplified input signal from the variable gain circuit and output therefrom an output signal, the analog circuit having an effective linear signal range that limits the permissible signal swing of the amplified input signal, wherein the effective linear signal range of the analog circuit varies with temperature; and
   (c) a temperature control circuit, responsive to temperature, and coupled to output the control signal to the variable gain circuit and thereby vary the signal swing of the amplified input signal such that the signal swing of the amplified input signal varies with variations in the effective linear signal range of the analog circuit.

2. The circuit arrangement of claim 1, wherein the temperature control circuit includes an output driver for receiving the output signal and outputting therefrom an amplified output signal, the output driver having a gain that varies with temperature inversely with respect to variations in the effective linear signal range of the analog circuit.

3. The circuit arrangement of claim 2, wherein the output driver and the variable gain circuit are configured to output the amplified output signal with a substantially fixed signal swing.

4. The circuit arrangement of claim 2, wherein the gain of the output driver decreases with an increase in temperature, and wherein the effective linear signal range of the analog circuit increases with an increase in temperature.

5. The circuit arrangement of claim 4, wherein the output driver comprises a bipolar differential amplifier including emitter-coupled pairs of bipolar transistors biased with zero temperature coefficient current and zero temperature coefficient collector load resistors.

6. The circuit arrangement of claim 5, wherein the emitter-coupled pairs of bipolar transistors are scaled with a 1:4 to 4:1 paralleled ratio.

7. The circuit arrangement of claim 2, wherein the temperature control circuit further includes an automatic gain control circuit which generates the control signal.

8. The circuit arrangement of claim 7, wherein the automatic gain control circuit includes an integrating capacitor coupled to the variable gain circuit and a charge pump coupled to the integrating capacitor and the variable gain circuit, wherein the charge pump selectively supplies and withdraws current to and from the capacitor to control the level of the control signal.

9. The circuit arrangement of claim 1, wherein the variable gain circuit comprises a variable gain amplifier.

10. The circuit arrangement of claim 1, wherein the analog circuit comprises a low pass filter including a plurality of operational transconductance amplifiers.

11. The circuit arrangement of claim 10, wherein each operational transconductance amplifier includes a bipolar differential amplifier including an emittercoupled pair of bipolar transistors.

12. The circuit arrangement of claim 11, wherein the emitter-coupled pair of bipolar transistors in each operational transconductance amplifier is scaled with a 1:4 to 4:1 paralleled ratio.

13. The circuit arrangement of claim 1, wherein the circuit arrangement is a partial response maximum likelihood (PRML) read/write channel in a hard disk drive system.

14. The circuit arrangement of claim 1, wherein the temperature control circuit controls the variable gain circuit to maintain the signal swing of the amplified input signal at least approximately a fixed amount less than a maximum signal swing permitted by the analog circuit at a given temperature.

15. A hard disk drive, comprising a partial response maximum likelihood (PRML) read/write channel coupled to a drive head to obtain a data signal from a storage medium, wherein the PRML read/write channel comprises:
   (a) a pre-amp coupled to amplify the data signal and generate an input signal therefrom;
   (b) a variable gain amplifier coupled to receive the input signal and output therefrom an amplified input signal, the variable gain amplifier having a gain that is controlled via a control signal;
   (c) a low pass filter coupled to receive the amplified input signal from the variable gain amplifier and output therefrom an output signal, the low pass filter having an effective linear signal range that limits the permissible signal swing of the amplified input signal, wherein the effective linear signal range of the low pass filter varies with temperature;
   (d) an output driver coupled to receive the output signal and output therefrom an amplified output signal, the output driver having a gain that varies with temperature inversely with respect to variations in the effective linear signal range of the low pass filter; and
   (e) an automatic gain control circuit, responsive to temperature, and coupled to output the control signal to the variable gain amplifier and thereby vary the signal swing of the amplified input signal such that the signal swing of the amplified input signal varies with variations in the effective linear signal range of the low pass filter.

16. The hard disk drive of claim 15, wherein the output driver and the variable gain amplifier are configured to output the amplified output signal with a substantially fixed signal swing.

17. The hard disk drive of claim 15, wherein:
(a) the output driver comprises a bipolar differential amplifier including emitter-coupled pairs of bipolar transistors biased with zero temperature coefficient current and zero temperature coefficient collector load resistors; and
(b) the low pass filter includes a plurality of operational transconductance amplifiers, each of which includes a bipolar differential amplifier including emitter-coupled pairs of bipolar transistors.

18. The hard disk drive of claim 17, wherein the emitter-coupled pairs of bipolar transistors in the output driver and in each operational transconductance amplifier are scaled with a 1:4 to 4:1 paralleled ratio.

19. The hard disk drive of claim 15, wherein the automatic gain control circuit includes an integrating capacitor coupled to the variable gain amplifier and a charge pump coupled to the integrating capacitor and the variable gain amplifier, wherein the charge pump selectively supplies and withdraws current to and from the capacitor to control the level of the control signal.

20. A method of varying a signal swing of an input to an analog circuit of the type having an effective linear signal range that limits the permissible signal swing of an input signal thereto and that varies with temperature, the method comprising the steps of:
(a) generating a control signal which varies with temperature; and
(b) in response to the control signal, controlling the gain of a variable gain circuit to amplify the input signal provided to the analog circuit such that the signal swing of the input signal varies with variations in the effective linear signal range of the analog circuit.

21. The method of claim 20, wherein the control signal generating step includes the step of passing an output signal from the analog circuit to an output driver having a gain which varies with temperature inversely with respect to variations in the effective linear signal range of the analog circuit, wherein the control signal is a function of an amplified output signal generated by the output driver.

22. The method of claim 21, wherein the generating step further includes the step of selectively supplying and withdrawing, with a charge pump, current to and from a capacitor coupled to the variable gain circuit to control the level of the control signal.

23. The method of claim 20, wherein the generating step is performed with an automatic gain control circuit.

24. The method of claim 20, wherein the analog circuit comprises a low pass filter including a plurality of operational transconductance amplifiers.

25. A circuit arrangement, comprising:
a variable gain circuit arranged to receive an input signal and output therefrom an amplified input signal;
an analog circuit arranged to receive the amplified input signal from the variable gain circuit and output therefrom an output signal, the analog circuit having a signal range which varies with temperature; and
a temperature control circuit, responsive to temperature, for controlling a gain of the variable gain circuit and thereby varying the signal swing of the amplified input signal such that the signal swing of the amplified input signal increases when the signal range of the analog circuit increases and such that the signal swing of the amplified input signal decreases when the signal range of the analog circuit decreases.

* * * * *